United States Patent
Uhlemann et al.

(10) Patent No.: US 6,770,878 B2
(45) Date of Patent: Aug. 3, 2004

(54) ELECTRON/ION GUN FOR ELECTRON OR ION BEAMS WITH HIGH MONOCHROMASY OR HIGH CURRENT DENSITY

(75) Inventors: Stephan Uhlemann, Heidelberg (DE); Maximilian Haider, Gaiberg (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 59 days.

(21) Appl. No.: 10/258,486

(22) PCT Filed: Jan. 31, 2001

(86) PCT No.: PCT/DE01/00409

§ 371 (c)(1), (2), (4) Date: Oct. 25, 2002

(87) PCT Pub. No.: WO01/82330

PCT Pub. Date: Nov. 1, 2001

(65) Prior Publication Data

US 2003/0098414 A1 May 29, 2003

(30) Foreign Application Priority Data

Apr. 26, 2000 (DE) .......................................... 100 20 382

(51) Int. Cl.[7] .............................................. H01J 40/00
(52) U.S. Cl. ................. 250/305; 250/311; 250/396 ML
(58) Field of Search ............................... 250/305, 311, 250/396 ML

(56) References Cited

U.S. PATENT DOCUMENTS

| | | | |
|---|---|---|---|
| 2,429,558 A | | 10/1947 | Marton |
| 4,812,652 A | | 3/1989 | Egle et al. |
| 5,097,126 A | * | 3/1992 | Krivanek ..................... 250/305 |
| 5,177,361 A | * | 1/1993 | Krahl et al. ................. 250/305 |
| 5,359,197 A | | 10/1994 | Komatsu et al. |
| 6,015,973 A | * | 1/2000 | Nunome ...................... 250/305 |
| 6,097,028 A | * | 8/2000 | Tsuno ......................... 250/305 |
| 6,140,645 A | * | 10/2000 | Tsuno ......................... 250/311 |
| 6,323,485 B1 | * | 11/2001 | Tsuno ......................... 250/311 |
| 6,384,412 B1 | * | 5/2002 | Krahl et al. ................. 250/305 |

FOREIGN PATENT DOCUMENTS

| | | |
|---|---|---|
| DE | 196 33 496 A1 | 2/1998 |
| EP | 0 883 157 A1 | 12/1998 |
| JP | 11-191384 A | 7/1999 |

* cited by examiner

*Primary Examiner*—John R. Lee
*Assistant Examiner*—Erin-Michael Gill
(74) *Attorney, Agent, or Firm*—Birch, Stewart, Kolasch & Birch, LLP

(57) ABSTRACT

The invention relates to an electron/ion gun for electron or ion beams, including a beam source and a monochromator. According to the invention, the monochromator is equipped with an additional beam guidance system and a switchover element which are provided at the input of the monochromator, and which convey the particles coming from the beam source to either the monochromator or the rest of the beam guidance system.

8 Claims, 1 Drawing Sheet

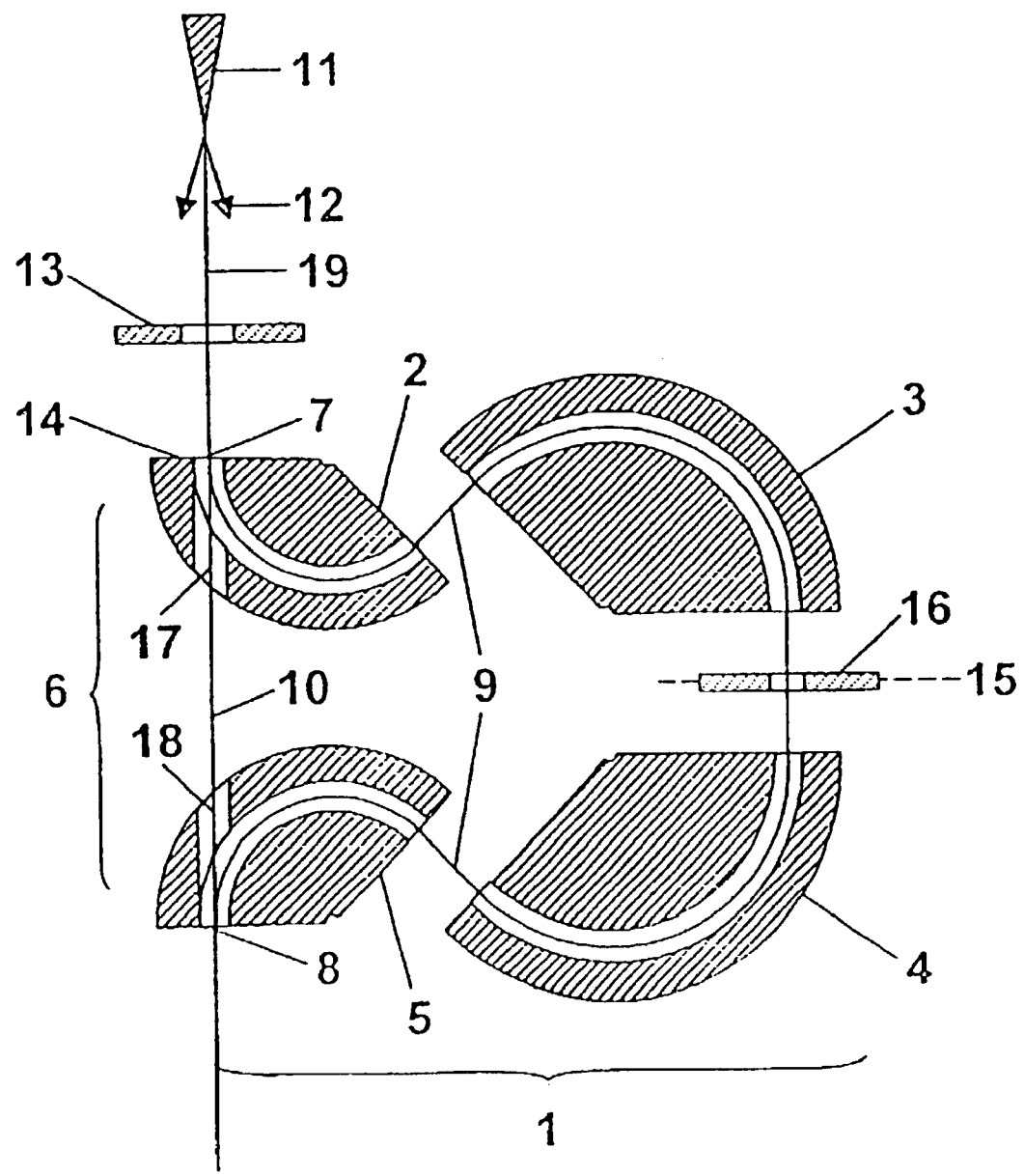

ELECTRON/ION GUN FOR ELECTRON OR ION BEAMS WITH HIGH MONOCHROMASY OR HIGH CURRENT DENSITY

This application is the national phase under 35 U.S.C. § 371 of PCT International Application No. PCT/DE01/00409 which has an International filing date of Jan. 31, 2001, which designated the United States of America.

BACKGROUND OF THE INVENTION

1. Field of the Invention

The invention relates to a beam generating system for electrons or ion beams comprising a monochromator with deflection fields, which, in the dispersive plane, generates an astigmatic intermediate image, and a slit aperture in the dispersive plane with an orientation of the slit in the direction of longitudinal extension of the intermediate image, the monochromator being equipped with an additional beam guidance system and having at its output a switch element, which guides the particles arriving from the particle source either into the monochromator or to the additional beam guidance system.

2. Discussion of the Background Art

For the investigation of microscopic structures, electron or ion beams are often used. In such cases, the particle beam emerging from a beam generation system is deflected under high vacuum onto the structures to be investigated. In the process, the particles of the particle beam, as a result of their interaction with the material to be investigated, undergo a change of their properties, which is recorded by means of detectors and, by means of these changes, information about the composition of the structures is obtained. Known methods based on this principle are, for example, X-ray analysis, electron-energy loss spectroscopy, transmission electron microscopy or scanning electron microscopy. This process also includes elementary analysis, in which the energy spectrum behind each point of the object is determined, and from the position of the point and the energy spectrum together, information about the object is obtained.

With these methods, the decisive parameters of the imaging particles are the particle current density and the monochromasy of the particles. In electron microscopy, in order, for example, to avoid chromatic aberrations, which limit the resolution of the system, electrons with a very low energy range, that is to say as high a monochromasy as possible, are required. On the other hand, electron-energy loss spectroscopy, for example, depends on high particle current densities to obtain a sufficient yield of scattered particles and thereby to allow the analysis to take place in a finite amount of time.

Known systems for generating particle streams are constructed such that they produce either high particle densities or high monochromasy (DE 196 33 496 A1). If it is desired alternatively to carry out analyses requiring both high particle densities and high monochromasy, it is necessary to use two different beam generating systems, which according to the prior art, are provided in separate apparatus.

The source Patent Abstracts of Japan, vol. 1999, no. 12, Oct. 29, 1999, already discloses a monochromator which operates with magnetic deflection fields and is arranged downstream of the scattering object for energetic analysis of the scattered electrons. The generation of an imaging beam with different properties (high monochromasy or high particle current density) is not known to this document.

SUMMARY OF THE INVENTION

The object of the invention is to provide a remedy for this disadvantage and to meet the need for a beam-generating system for electrons or ions, which optionally provides a particle beam with high monochromasy with low particle current density or a beam with high particle current density and low monochromasy.

Based on a beam-generating system with beam source and monochromator, this object is achieved in that the monochromator has electrostatic deflection fields and a beam source is present, which is imaged by the deflection fields to form an astigmatic intermediate image.

Depending on the particle path determined by the switch element, particle beams with different particle properties are generated. In the case of a particle path through the monochromator, at the latter's output, a particle stream of high monochromasy is provided, and with the alternative path through the additional beam guidance system, a particle stream with high particle current density is provided.

The beam generating system according to the invention allows two beam generating systems of conventional design to be replaced by a single device and, optionally particle beams with the above-described different properties to be provided within one and the same apparatus. For the analysis of microscopic structures, this results, in the advantage that studies on one and the same object and at the same location by different methods can be carried out with the same apparatus.

By the reduction of the outlay for the apparatus, considerable costs are saved since apparatus of the aforementioned kind require very high manufacturing precision and are correspondingly expensive. A considerable time and cost saving also arises from the fact that investigations according to different methods can be carried out with the same apparatus.

In an expedient device, an additional beam guidance system is arranged such that it provides a direct, that is to say immediate, connection between the input and output of the monochromator. This embodiment permits a very compact design of the beam generation system, since the overall size is determined to a large extend solely by the size of the monochromator.

For a compact design, but also as regards simple constructional implementation, it is also of benefit if the switch system itself forms a subsystem of the monochromator. The term "subsystem" in the sense of the invention means that part of the deflection field of the monochromator is used for switching. The beam path generated by the additional beam guidance system is in the case generated by a beam passage in the deflection field.

When the beam generation system is used in studies with different requirements on particle current density and monochromasy, it is advantageous if the current density can be regulated. In the beam generation according to the invention, it is proposed to carry out this regulation by means of an aperture which is disposed between the switch element and beam source and is aligned so as to be displaceable perpendicular to the optical axis by means of an adjustment device. In addition or alternatively to this, the regulation of the current density can also be carried out by means of the beam source. For this case, the beam source is also equipped with an adjustment device, by means of which the beam source can be displaced perpendicular to the optical axis.

The adjustment device for the aperture and/or beam source allows at least two setting, one setting making available a maximum particle current density and the other a low particle current density at the output of the beam generation system. The setting with maximum particle current density is provided by the fact that the aperture and beam source are optimally adjusted, which is the case when the center point of the aperture and beam source lie on the optical axis of the additional beam guidance system. In this case the maximum possible of particles, limited only by the aperture diameter, passes through the aperture. A displacement of the respective center points of the aperture and/or beam source out of this position in a direction perpendicular to the optical axis leads in each case to a reduction of the particle current density available at the output from the beam generator. A small particle current density is important in particular where the beam generator system is used for producing particles of high monochromasy, since the low density reduces the influence of the Boersch effect. This term describes the phenomenon that, when electron beams are focused to a point, the energy width of the beam undergoes a drastic widening as a result of the high current density prevailing in this region and the resultant influencing of the electrons.

In an advantageous development, the adjustment device for displacing the aperture and/or beam source is formed by means of a piezoelectric element in which the stepwise displacement is produced by application of an electrical alternating voltage. With this element, the apertures and/or radiation source can be very precisely positioned. The desired position is set by a corresponding duration of the displacement.

Adjustment by means of a piezoelement has the advantage over mechanical adjustment devices a high positioning accuracy. As an additional advantage, it can also be seen that no external mechanical adjustment elements are necessary. Since the beam generating system according to the invention is used under high vacuum, this eliminates the need for technically complicated passages through the walls of the vacuum vessel.

An advantageous development of the beam generation system according to the invention, with the use of electrostatic fields within the monochromator, has electrodes which are delimited at least piece-wise in sections perpendicular to the optical axis by means of straight lines, and extend mirror-symmetrically to a plane including the optical axis. By virtue of the piece-wise straight surface design, the outlay for producing these electrodes is kept comparatively small.

BRIEF DESCRIPTION OF THE DRAWINGS

Further details, features and advantages of the invention can be taken from the following descriptive part, wherein an embodiment of the beam generating system according to the invention is illustrated with reference to a drawing.

The drawing shows a section through the beam generating system, which is placed by the optical axis of the monochromator and an additional beam guidance system.

DETAILED DESCRIPTION OF THE PREFERRED EMBODIMENT

The monochromator (1) with its deflection elements (2–5) is constructed in the shape of an Ω. The additional beam guidance system (6) is arranged between the input (7) and output (8) of the monochromator. The optical axis of the monochromator is designated by the reference character (9). The reference character (10) designates the optical axis of the beam guidance system.

The particle stream (12) coming from the beam source (11) is deflected by the aperture (13) for regulating the particle current density. It subsequently passes the switch element (14), which in the embodiment shown here forms a subelement of the monochromator. Depending on the switch state of the switch element, the particle stream is either deflected through the monochromator or guided to the additional beam system (6).

In one particle stream path through the monochromator, the beam is subsequently split in the dispersive plane (15) according to the energy of the particles. By means of a slit aperture (16), which is arranged in this plane and whose slit, in the present embodiment of the monochromator, stands perpendicular to the drawing plane, the particles are selected according to energies. Here, as a result of the width of the aperture, the width of the energy spectrum is determined, and, as a result of the distance of the aperture center point from the optical axis, the mean energy of the particle beam is determined. With an adjustment of the slit aperture to a small width, a particle beam of high monochromasy is provided at the output (8) of the monochromator.

With a path of the particle stream through the additional beam guidance system (6), the particle stream, in the present embodiment, passes through a beam passage (17) in the deflector element and is again directed into the monochromator through a beam passage (18), of the same shape, at the monochromator outlet. With an optimum adjustment of the radiation source (11) and aperture (13), that is to say, for example, when their center points lie on the optical axis (19) of the beam generation system, a particle beam of high current density is provided at the output of the additional beam guidance system, which in the present embodiment is congruent with the output of the monochromator.

What is claimed is:

1. A beam generating system for electrons or ion beams comprising:

a monochromator with deflection fields, which, in the dispersive plane, generates an astigmatic intermediate image of the beam source, and a slit aperture in the dispersive plane with an orientation of the slit in the direction of longitudinal extension of the astigmatic intermediate image, the monochromator being equipped with an additional beam guidance system and having at its output a switch element, which guides the particles arriving from the particle source either into the monochromator or to the additional beam guidance system, wherein the monochromator is equipped with deflection fields and a radiation source is present, which is imaged by the deflection fields to form the astigmatic intermediate image.

2. The beam generation system according to claim 1, wherein the additional beam guidance system produces a direct connection between the input and output of the monochromator.

3. The beam generation system according to claim 1 or 2, wherein the switch element represents part of a deflection field of the monochromator itself, and has a beam passage for the ray path generated by the additional beam guidance system.

4. The beam generation system according to claim 1, wherein regulation is performed by means of the aperture which is disposed between the switch element and the beam source and is aligned so as to be displaceable perpendicular to an optical axis of the system by means of an adjustment device.

5. The beam generation system according to claim 1, wherein an adjustment system is provided, by means of which the beam source can be displaced perpendicular to an optical axis of the system.

6. The beam generation system according to claim 4 or 5, wherein the adjustment device includes a piezoelectric element.

7. The beam generation system according to claim 1, wherein electrodes generating the fields are delimited at least piecewise in sections perpendicular to an optical axis of the system by means of straight lines, and extend mirror-symmetrically to a plane including the optical axis.

8. The beam generation system according to claim 1, wherein the beam generation system is located in the beam path of an electron-optical system.

* * * * *